(12) United States Patent
Gu et al.

(10) Patent No.: US 12,402,356 B2
(45) Date of Patent: Aug. 26, 2025

(54) THIN FILM TRANSISTOR AND MANUFACTURING METHOD THEREOF, ARRAY SUBSTRATE, AND DISPLAY DEVICE

(71) Applicant: BOE TECHNOLOGY GROUP CO., LTD., Beijing (CN)

(72) Inventors: Pengfei Gu, Beijing (CN); Fengjuan Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 503 days.

(21) Appl. No.: 17/255,787

(22) PCT Filed: Apr. 17, 2020

(86) PCT No.: PCT/CN2020/085403
§ 371 (c)(1),
(2) Date: Dec. 23, 2020

(87) PCT Pub. No.: WO2020/211851
PCT Pub. Date: Oct. 22, 2020

(65) Prior Publication Data
US 2021/0143280 A1    May 13, 2021

(30) Foreign Application Priority Data
Apr. 19, 2019 (CN) .......................... 201910318847.7

(51) Int. Cl.
*H10D 30/67* (2025.01)
*H10D 30/01* (2025.01)
(52) U.S. Cl.
CPC ....... *H10D 30/6755* (2025.01); *H10D 30/031* (2025.01); *H10D 30/6713* (2025.01)

(58) Field of Classification Search
None
See application file for complete search history.

(56) References Cited

U.S. PATENT DOCUMENTS 10,818,647 B2 * 10/2020 Kim .................. H10H 20/8314
2011/0278590 A1    11/2011 Mieczkowski
(Continued)

FOREIGN PATENT DOCUMENTS

| CN | 102668028 A | 9/2012 |
| CN | 103229305 A | 7/2013 |

(Continued)

OTHER PUBLICATIONS

China Patent Office, First Office Action issued Feb. 2, 2021 for application No. CN201910318847.7.
(Continued)

*Primary Examiner* — Vincent Wall
(74) *Attorney, Agent, or Firm* — HOUTTEMAN LAW LLC

(57) ABSTRACT

The present disclosure provides a TFT. The TFT includes an active layer and a gate insulating layer, the active layer includes a first active sub-layer and a second active sub-layer which are arranged in a stacked manner, the second active sub-layer is between the gate insulating layer and the first active sub-layer, a Fermi potential of the first active sub-layer is larger than a Fermi potential of the second active sub-layer, a maximum thickness of a depletion region in the first active sub-layer is equal to a thickness of the first active sub-layer, and a maximum thickness of a depletion region in the second active sub-layer is equal to a thickness of the second active sub-layer.

15 Claims, 10 Drawing Sheets

(56) References Cited

U.S. PATENT DOCUMENTS

| | | | |
|---|---|---|---|
| 2011/0309411 A1 | 12/2011 | Takemura | |
| 2011/0315936 A1* | 12/2011 | Inoue | H01L 29/7869 |
| | | | 252/519.1 |
| 2015/0011048 A1 | 1/2015 | Tanaka et al. | |
| 2015/0102332 A1* | 4/2015 | Shin | H01L 29/7869 |
| | | | 438/23 |
| 2015/0108481 A1* | 4/2015 | Khang | H01L 29/78696 |
| | | | 438/34 |
| 2015/0179774 A1* | 6/2015 | Yamazaki | H01L 21/02631 |
| | | | 438/104 |
| 2017/0263783 A1* | 9/2017 | Yamazaki | G02F 1/1368 |
| 2017/0317228 A1* | 11/2017 | Sung | H10H 20/84 |
| 2018/0308984 A1* | 10/2018 | Liu | H01L 21/383 |
| 2019/0172953 A1* | 6/2019 | Ding | H01L 29/78618 |
| 2022/0209019 A1* | 6/2022 | Baeck | H10D 30/6734 |
| 2023/0060645 A1* | 3/2023 | He | H01L 21/02565 |
| 2023/0077265 A1* | 3/2023 | Kim | H10D 62/80 |

FOREIGN PATENT DOCUMENTS

| | | | | |
|---|---|---|---|---|
| CN | 104882486 A | | 9/2015 | |
| CN | 107994066 A | * | 5/2018 | ......... H01L 27/1225 |
| CN | 108987482 A | | 12/2018 | |
| CN | 110034178 A | | 7/2019 | |
| JP | 6066864 A | | 4/1985 | |

OTHER PUBLICATIONS

China Patent Office, Second Office Action issued Nov. 3, 2021 for application No. CN201910318847.7.

\* cited by examiner

THIN FILM TRANSISTOR AND MANUFACTURING METHOD THEREOF, ARRAY SUBSTRATE, AND DISPLAY DEVICE

CROSS REFERENCE TO RELATED APPLICATIONS

This is a National Phase Application filed under 35 U.S.C 371 as a national stage of PCT/CN2020/085403, filed on Apr. 17, 2020, an application claiming priority from Chinese patent application No. 201910318847.7, filed on Apr. 19, 2019, to the National Intellectual Property Administration, PRC, the contents of which are incorporated herein by reference in their entirety.

TECHNICAL FIELD

The present disclosure relates to the field of display technology, and in particular, to a thin film transistor and a manufacturing method thereof, an array substrate and a display device.

BACKGROUND

A conventional oxide thin film transistor (TFT) generally includes an active layer, a gate electrode, a source electrode, and a drain electrode, and a gate insulating layer is disposed between the active layer and the gate electrode. When voltages supplied to the source electrode and the drain electrode are fixed, on/off states of the TFT can be controlled by controlling a voltage supplied to the gate electrode.

SUMMARY

An aspect of the present disclosure provides a TFT including an active layer and a gate insulating layer, the active layer includes a first active sub-layer and a second active sub-layer which are arranged in a stacked manner, the second active sub-layer is between the gate insulating layer and the first active sub-layer, a Fermi potential of the first active sub-layer is larger than a Fermi potential of the second active sub-layer, a maximum thickness of a depletion region in the first active sub-layer is equal to a thickness of the first active sub-layer, and a maximum thickness of a depletion region in the second active sub-layer is equal to a thickness of the second active sub-layer.

According to an embodiment of the present disclosure, in response to a gate voltage applied to a gate electrode of the TFT being less than or equal to a threshold voltage of the TFT, each of a thickness of the depletion region in the first active sub-layer and a thickness of the depletion region in the second active sub-layer is at its maximum thickness.

According to an embodiment of the present disclosure, in response to the gate voltage being greater than the threshold voltage and equal to or less than a first voltage, as the gate voltage increases, the thickness of the depletion region in the first active sub-layer gradually decreases and the thickness of the depletion region in the second active sub-layer is at its maximum thickness, and the first voltage is a voltage that causes the thickness of the depletion region in the first active sub-layer to be zero.

According to an embodiment of the present disclosure, in response to the gate voltage being greater than the first voltage and less than a second voltage, as the gate voltage increases, the thickness of the depletion region in the first active sub-layer remains zero and the thickness of the depletion region in the second active sub-layer gradually decreases, and the second voltage is a voltage that causes the thickness of the depletion region in the second active sub-layer to be zero.

According to an embodiment of the present disclosure, the second active sub-layer is in direct contact with the gate insulating layer.

According to an embodiment of the present disclosure, carrier concentration of the first active sub-layer is greater than carrier concentration of the second active sub-layer.

According to an embodiment of the present disclosure, the first active sub-layer and the second active sub-layer are made of a same material which comprises an oxide semiconductor material.

According to an embodiment of the present disclosure, the oxide semiconductor material includes indium gallium zinc oxide.

According to an embodiment of the present disclosure, the TFT further includes a gate electrode on a side of the gate insulating layer facing away from the active layer, a source electrode and a drain electrode both electrically connecting to the active layer.

According to an embodiment of the present disclosure, the TFT is a top gate type TFT, a region of the second active sub-layer which is not covered by the gate insulating layer is converted into conductor, and a region of the first active sub-layer which is not covered by an orthogonal projection of the gate insulating layer on the first active sub-layer is converted into conductor.

Another aspect of the present disclosure provides an array substrate including the TFT described above.

Another aspect of the present disclosure provides a display device including the array substrate described above.

Another aspect of the present disclosure provides a manufacturing method of a TFT including: forming a gate insulating layer and forming an active layer including a first active sub-layer and a second active sub-layer which are arranged in a stacked manner, the second active sub-layer is between the gate insulating layer and the first active sub-layer, a Fermi potential of the first active sub-layer is larger than a Fermi potential of the second active sub-layer, a maximum thickness of a depletion region in the first active sub-layer is equal to a thickness of the first active sub-layer, and a maximum thickness of a depletion region in the second active sub-layer is equal to a thickness of the second active sub-layer.

According to an embodiment of the present disclosure, forming the active layer includes forming a first active material thin film; forming a second active material thin film; and performing a patterning process on the first active material thin film and the second active material thin film to form a pattern of the first active sub-layer and a pattern of the second active sub-layer.

According to an embodiment of the present disclosure, the first active material thin film and the second active material thin film are made of a same material; forming the first active material thin film includes forming the first active material thin film by magnetron sputtering in a process environment with an oxygen partial pressure of a first preset value a1; forming the second active material thin film includes forming the second active material thin film by magnetron sputtering in a process environment with an oxygen partial pressure of a second preset value a2, the first preset value a1 and the second preset value a2 satisfy: $a1 \in [0, 60\%]$, $a2 \in [0, 60\%]$, and a1 is less than a2.

According to an embodiment of the present disclosure, forming the gate insulating layer and forming the active layer include forming the first active material thin film on a side of a base substrate; forming a second active material thin film on a side of the first active material thin film facing away from the base substrate; performing a pattern process on the first active material thin film and the second active material thin film to form the pattern of the first active sub-layer and the pattern of the second active sub-layer; forming a gate insulating material thin film on a side of the second active sub-layer facing away from the base substrate; and performing a pattern process on the gate insulating material thin film to form a pattern of the gate insulating layer.

According to an embodiment of the present disclosure, the manufacturing method further includes converting a region of the second active sub-layer which is not covered by the gate insulating layer into conductor, and converting a region of the first active sub-layer which is not covered by an orthogonal projection of the gate insulating layer on the first active sub-layer into conductor.

According to an embodiment of the present disclosure, the manufacturing method further includes forming a gate electrode on a side of the gate insulating layer facing away from the base substrate; forming an interlayer dielectric layer on a side of the gate electrode facing away from the base substrate, via holes connected to the second active sub-layer are formed in the interlayer dielectric layer; and forming a source electrode and a drain electrode on a side of the interlayer dielectric layer facing away from the base substrate, the source electrode and the drain electrode are connected to the second active sub-layer through the via holes, respectively.

According to an embodiment of the present disclosure, forming the gate insulating layer and forming the active layer include forming, on a side of the base substrate, a gate insulating material thin film as the gate insulating layer; forming a second active material thin film on a side of the gate insulating layer facing away from the base substrate; forming a first active material thin film on a side of the second active material thin film facing away from the base substrate; and performing a patterning process on the first active material thin film and the second active material thin film to form a pattern of the first active sub-layer and a pattern of the second active sub-layer.

According to an embodiment of the present disclosure, before forming the gate insulating material thin film on the side of the base substrate, the manufacturing method further includes forming a gate electrode on the side of the base substrate; after performing the patterning process on the first active material thin film and the second active material thin film, the manufacturing method further includes forming a source electrode and a drain electrode on a side of the first active sub-layer facing away from the base substrate.

DETAILED DESCRIPTION

In order to enable those skilled in the art to better understand technical solutions of the present disclosure, a TFT and a manufacturing method thereof, an array substrate, and a display device provided in the present disclosure are described in detail below with reference to accompanying drawings.

In a TFT, since an active layer has a single-layer structure and is in contact with a gate insulating layer, when a conductive channel is formed in the active layer, an defect of an interface between the active layer and the gate insulating layer and an internal defect of the gate insulating layer may affect electrical characteristics of the conductive channel (for example, carriers in the conductive channel may be captured by the interface between the active layer and the gate insulating layer), which may result in a decrease in positive-bias temperature stability (PBTS) of the TFT, thereby affecting a service life of the TFT.

A TFT according to an embodiment of the present disclosure may be an oxide type TFT, which is an N-type device. When a gate-source voltage Vgs (a difference between a gate voltage Vg and a source voltage Vs) is greater than a threshold voltage, the TFT is in a turn-on state.

In following embodiments, illustrative description is made by taking the source voltage Vs as a reference voltage (0V) as an example, and in this case, the gate voltage Vg may represent the gate-source voltage Vgs.

Figure 1:
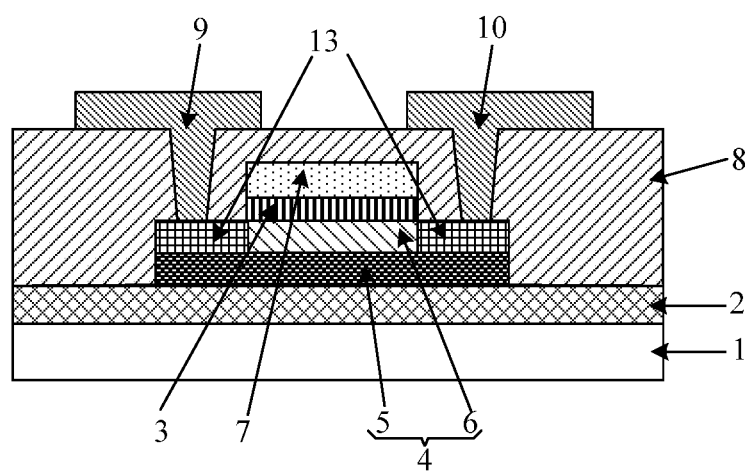
FIG. 1 is a schematic diagram of a structure of a TFT according to an embodiment of the present disclosure.

FIG. 1 is a schematic diagram of a structure of a TFT according to an embodiment of the present disclosure. As shown in FIG. 1, the TFT includes a gate electrode 7, a source electrode 9, a drain electrode 10, and an active layer 4 and a gate insulating layer 3 which are arranged in a stacked manner. The gate electrode 7 is positioned on a side of the gate insulating layer 3 facing away from the active layer 4. The source electrode 9 and the drain electrode 10 are electrically connected to the active layer 4. The active layer 4 includes a first active sub-layer 5 and a second active sub-layer 6 which are arranged in the stacked manner, the second active sub-layer 6 is positioned between the gate insulating layer 3 and the first active sub-layer 5, a Fermi potential of the first active sub-layer 5 is larger than that of the second active sub-layer 6, a maximum thickness of a depletion region in the first active sub-layer 5 is equal to a thickness of the first active sub-layer 5, and a maximum thickness of a depletion region in the second active sub-layer 6 is equal to a thickness of the second active sub-layer 6.

According to an embodiment of the present disclosure, the maximum thickness of the depletion region in the active layer depends on a dielectric constant, a Fermi potential and doping concentration of the active layer.

It should be noted that the TFT shown in FIG. 1 is a top gate type TFT, that is, the gate electrode 7, the gate insulating layer 3, the source electrode 9, and the drain electrode 10 are positioned on a side of the active layer 4 facing away from a base substrate 1. In addition, an interlayer dielectric layer 8 is disposed on the gate electrode 7. The source electrode 9 and the drain electrode 10 are connected to the second active sub-layer 6 through via holes in the interlayer dielectric layer 8, respectively.

According to an embodiment of the present disclosure, a buffer layer 2 may be further disposed between the active layer 4 and the base substrate 1 and used to alleviate lattice mismatch between the base substrate 1 and the active layer 4.

Figure 2:
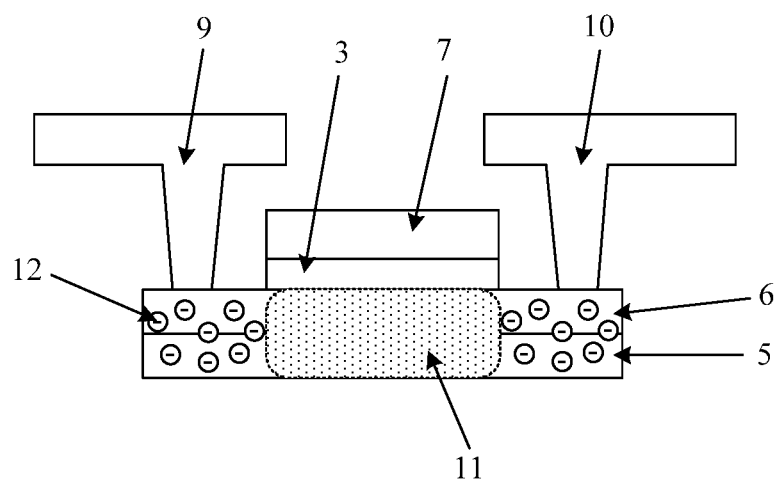
FIG. 2 is a schematic diagram showing the TFT shown in FIG. 1 is in a turn-off state.
Figure 3:
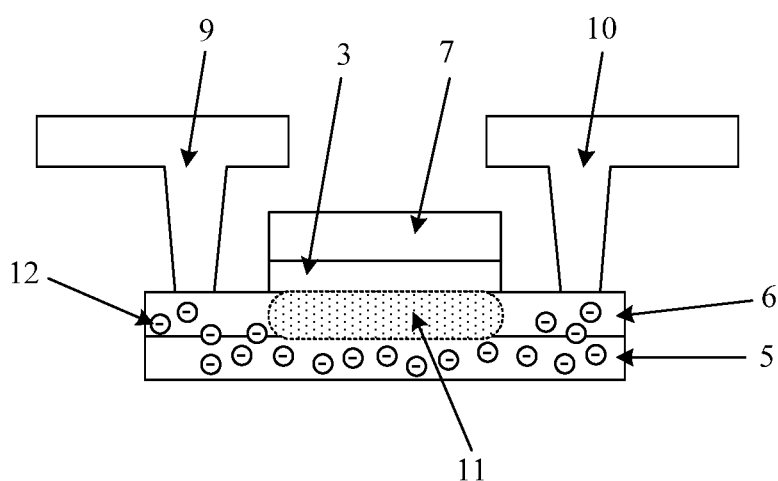
FIG. 3 is a schematic diagram showing the TFT shown in FIG. 1 is in a buried channel turn-on state.
Figure 4:
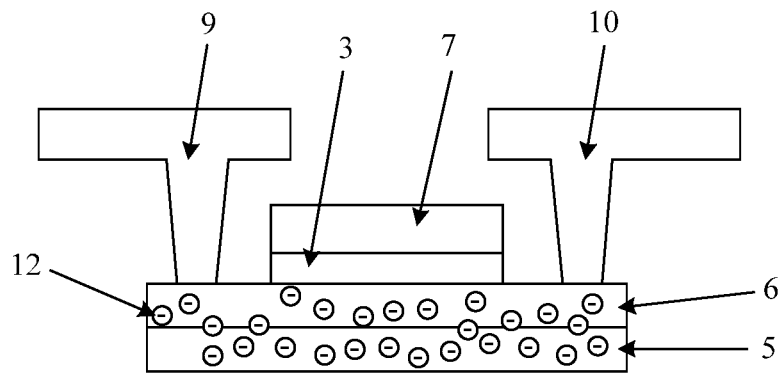
FIG. 4 is a schematic diagram showing the TFT shown in FIG. 1 is in a fully turn-on state.

According to an embodiment of the present disclosure, it is assumed that after completing manufacturing of the TFT, a threshold voltage of the TFT is Vth. FIG. 2 is a schematic diagram showing the TFT shown in FIG. 1 is in a turn-off state, FIG. 3 is a schematic diagram showing the TFT shown in FIG. 1 is in a buried channel turn-on state, and FIG. 4 is a schematic diagram showing the TFT shown in FIG. 1 is in a fully turn-on state. As shown in FIGS. 2 to 4, the TFT according to an embodiment of the present disclosure may operate in the following three states.

1) A turn-off state: referring to FIG. 2, when the gate voltage Vg is less than or equal to the threshold voltage Vth of the TFT, the first active sub-layer 5 and the second active sub-layer 6 are both in a depletion state, and a thickness of a depletion region 11 in the active layer 4 (including a depletion region in the first active sub-layer 5 and a depletion region in the second active sub-layer 6) is at a maximum thickness, so that carriers 12 cannot migrate, and the TFT is in the turn-off state.

2) A buried channel turn-on state: referring to FIG. 3, when the gate voltage Vg is gradually increased to be greater than Vth and less than or equal to a critical voltage Vc, the thickness of the depletion region in the first active sublayer 5 gradually decreases as the gate voltage Vg gradually increases, and the thickness of the depletion region in the second active sublayer 6 is always at the maximum thickness, that is, the thickness of the depletion region 11 in the active layer 4 decreases, the carriers 12 can migrate in the first active sub-layer 5 with a larger Fermi potential, a conductive channel is formed in the first active sub-layer 5, the second active sub-layer 6 with a smaller Fermi potential is in a depletion state and is not conductive, and at this time, the TFT is in the buried channel turn-on state. According to an embodiment of the present disclosure, the critical voltage Vc is a voltage at which the thickness of the depletion region in the first active sub-layer 5 is zero. FIG. 3 shows a state where the thickness of the depletion region in the first active sub-layer 5 is zero, in this case, the second active sub-layer 6 exists between the conductive channel and the gate insulating layer 3, and since the conductive channel is not in contact with the gate insulating layer 3, a defect of an interface between the active layer 4 and the gate insulating layer 3 and an internal defect of the gate insulating layer 3 do not affect the conductive channel, that is, electrical characteristics of the conductive channel will not be significantly deviated, so that positive-bias temperature stability of the TFT can be improved.

It should be noted that, in order to facilitate the carriers 12 in the buried channel to reach the source electrode 9 or the drain electrode 10 more quickly, regions 13 (referring to FIG. 1) of the second active sub-layer 6 which are not covered by the gate insulating layer 3 may be converted into conductor to enhance carrier mobility. Of course, at the same time, regions of the first active sub-layer 5 which are not covered by an orthographic projection of the gate insulation layer 3 on the first active sub-layer 5 may also be converted into conductor (not shown) to reduce resistance between the source electrode 9/drain electrode 10 and the buried channel.

3) A fully turn-on state: as shown in FIG. 4, when the gate voltage Vg is further increased to be greater than the critical voltage Vc, the thickness of the depletion region in the second active sub-layer 6 with the smaller Fermi potential gradually decreases as the gate voltage Vg increases, and induced carriers are generated in the second active sub-layer 6, so that the thickness of the conductive channel is gradually increased. As the gate voltage Vg continues to increase to a fully turn-on voltage Vf (Vf>Vc>Vth) or even greater, the thickness of the depletion region in the second active sublayer 6 decreases to zero, i.e., the depletion region 11 within the active layer 4 disappears. FIG. 4 shows a state where the depletion region 11 in the active layer 4 disappears, and in this case, the TFT is in the fully turn-on state.

According to an embodiment of the present disclosure, the buried channel of the TFT is not limited to the state shown in FIG. 3, and a channel of the TFT may be referred to as the buried channel as long as the gate voltage Vg is greater than the threshold voltage Vth and less than the fully turn-on voltage Vf, that is, as along as the thickness of the depletion region 11 in the active layer 4 is less than the thickness of the active layer 4 and greater than zero. That is, the depletion region 11 of the active layer 4 exists between the buried channel of the TFT and the gate insulating layer 3.

Therefore, in practical application, the positive-bias temperature stability of the TFT can be improved by controlling magnitude of the gate voltage Vg to ensure that the TFT is in the buried channel turn-on state when the TFT is turned on.

According to an embodiment of the present disclosure, the Fermi potential of the first active sub-layer 5 may be made larger than the Fermi potential of the second active sub-layer 6 by setting carrier concentration of the first active sub-layer 5 to be larger than that of the second active sub-layer 6.

According to an embodiment of the present disclosure, materials of the first and second active sub-layers 5 and 6 are the same, and the materials of the first and second active sub-layers 5 and 6 each include an oxide semiconductor material, and the Fermi potentials of the first and second active sub-layers 5 and 6 can be controlled by controlling concentration of carriers in the oxide semiconductor material. Further, the oxide semiconductor material includes Indium Gallium Zinc Oxide (IGZO). The IGZO has high carrier mobility, and can greatly improve charge/discharge rate of the TFT to other devices (such as a pixel electrode).

Figure 5:
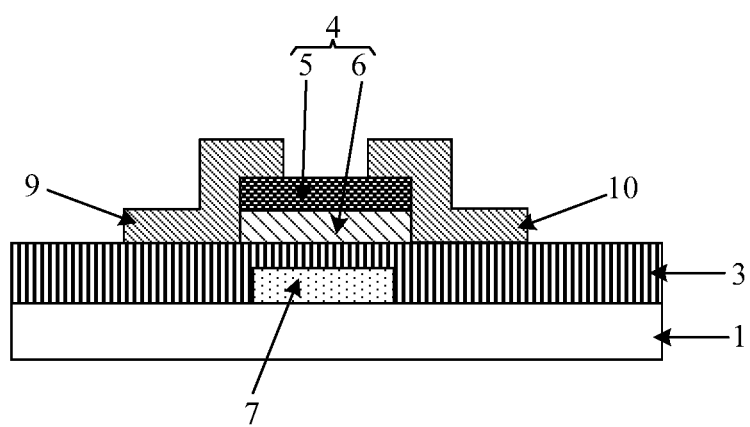
FIG. 5 is a schematic diagram of a structure of a TET according to another embodiment of the present disclosure.

FIG. 5 is a schematic diagram of a structure of a TFT according to another embodiment of the present disclosure. As shown in FIG. 5, unlike the TFT shown in FIG. 1, the TFT in FIG. 5 is a bottom gate type TFT, namely, a gate electrode 7 and a gate insulating layer 3 are positioned on a side of an active layer 4 close to a base substrate 1, and a source electrode 9 and a drain electrode 10 are positioned on a side of the active layer 4 facing away from the base substrate 1.

It should be noted that, in the TFT shown in FIG. 5, when a gate voltage Vg is equal to a critical voltage Vc higher than a threshold voltage Vth, a thickness of a depletion region in a first active sub-layer 5 with a larger Fermi potential is zero, a conductive channel is formed in the first active sub-layer 5, and a second active sub-layer 6 with a smaller Fermi potential is in a depletion state and is not conductive, at this time, the TFT works in a buried channel turn-on state, so that the TFT has better positive-bias temperature stability. When the gate voltage Vg continues to increase to a fully turn-on voltage Vf after reaching the critical voltage Vc, a thickness of a depletion region in the second active sub-layer 6 is zero, that is, a thickness of a depletion region in the active layer 4 is zero, so that the TFT is in a fully turn-on state.

An embodiment of the present disclosure further provides a manufacturing method of a TFT, and the manufacturing method comprises steps Sa and Sb.

In step Sa, a gate insulating layer is formed.

In step Sb, an active layer is formed, the active layer including a first active sub-layer and a second active sub-layer which are arranged in a stacked manner, the active layer and the gate insulating layer are arranged in the stacked manner, the second active sub-layer is located between the gate insulating layer and the first active sub-layer, a Fermi potential of the first active sub-layer is larger than that of the second active sub-layer, a maximum thickness of a depletion region in the first active sub-layer is equal to a thickness of the first active sub-layer, and a maximum thickness of a depletion region in the second active sub-layer is equal to a thickness of the second active sub-layer.

In some embodiments, step Sb includes respectively forming a first active material thin film and a second active material thin film, and then, performing one patterning process on the first active material thin film and the second active material thin film to form a pattern of the first active sub-layer and a pattern of the second active sub-layer.

It should be noted that, in the present disclosure, the second active material thin film may be formed after the first active material thin film is formed, or the second active material thin film may be formed before the first active material thin film is formed, according to actual situations.

In addition, in the present disclosure, step Sa may be performed before or after step Sb, and both cases fall within the scope of the present disclosure. The details will be described in the following.

Figure 6:
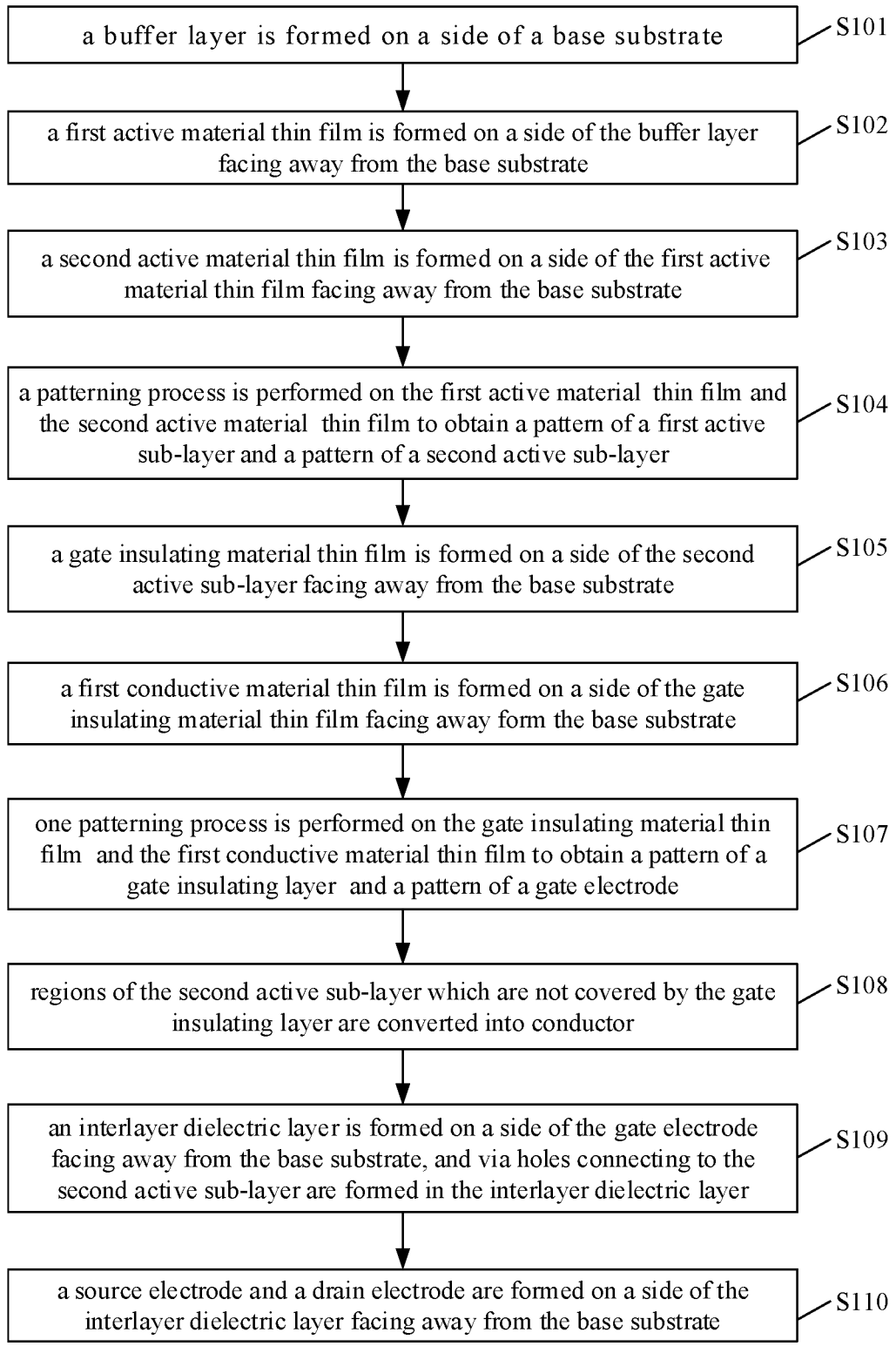
FIG. 6 is a flowchart of a manufacturing method of a TFT according to an embodiment of the present disclosure.
Figure 7A:
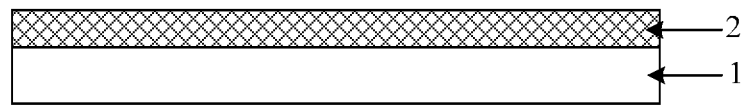
FIGS. 7a to 7i are schematic diagrams of intermediate structures of a TFT manufactured by using the manufacturing method provided in FIG. 6.
Figure 7B:
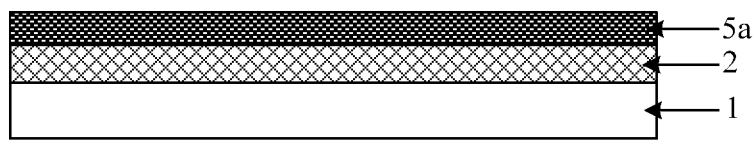
Figure 7C:
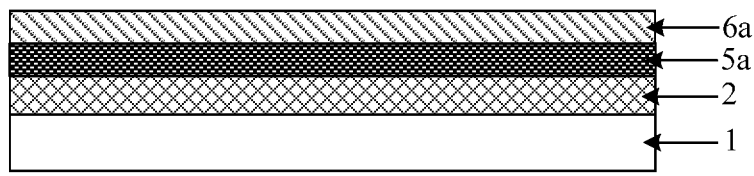
Figure 7D:
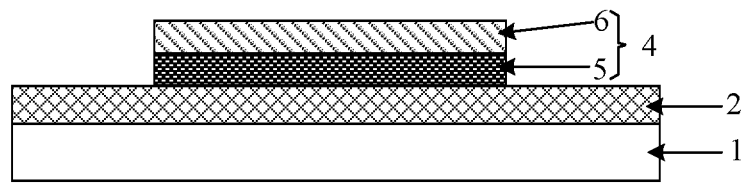
Figure 7E:
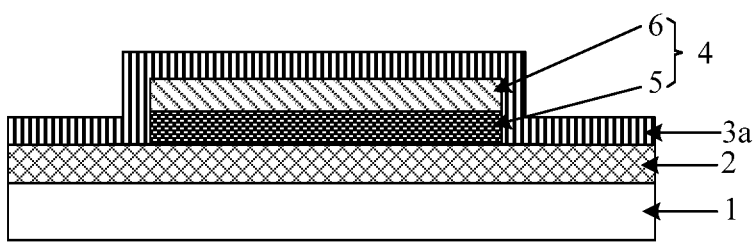
Figure 7F:
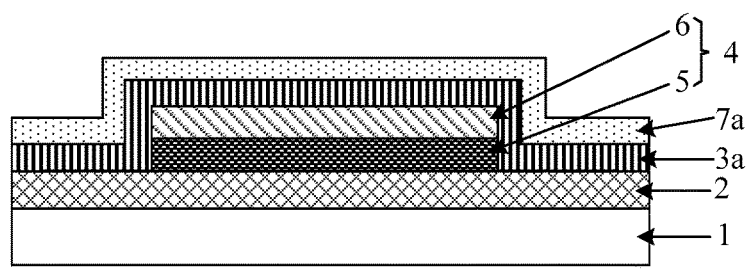
Figure 7G:
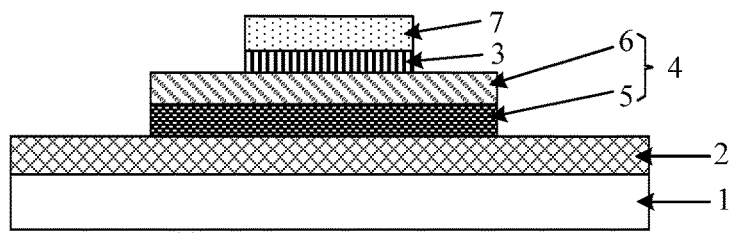
Figure 7H:
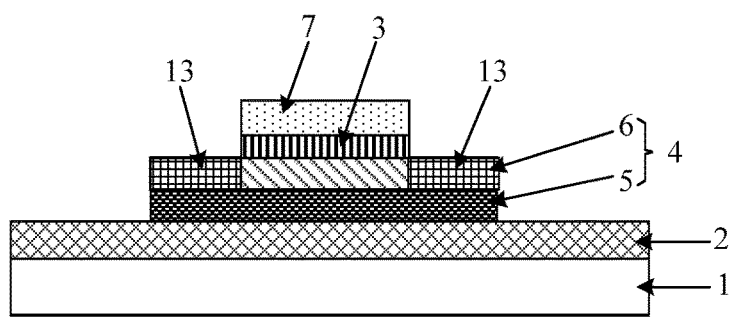
Figure 7I:
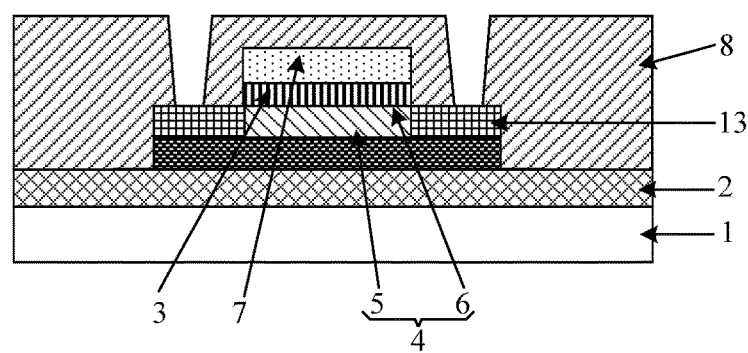

FIG. 6 is a flowchart of a manufacturing method of a TFT according to an embodiment of the present disclosure, and FIGS. 7a to 7i are schematic diagrams of intermediate structures of a TFT manufactured by using the manufacturing method provided in FIG. 6. As shown in FIGS. 6 to 7i, the manufacturing method may be used to manufacture the TFT shown in FIG. 1, and the manufacturing method includes steps S101 to S110.

In step S101, a buffer layer 2 is formed on a side of a base substrate 1, as shown in FIG. 7a. A material of the buffer layer 2 includes silicon oxide.

In step S102, a first active material thin film 5a is formed on a side of the buffer layer 2 facing away from the base substrate 1.

According to an embodiment of the present disclosure, a thickness of the first active material thin film 5a is equal to a maximum thickness of a depletion region in the first active material thin film 5a.

Referring to FIG. 7b, in step S102, the first active material thin film 5a is formed by magnetron sputtering in a process environment with an oxygen partial pressure of a first preset value a1. In an embodiment of the present disclosure, a process gas (generally, an inert gas such as argon) and oxygen are introduced into a process chamber, and then the gases in the process chamber are excited into plasma by using a magnetic field, and the plasma bombards a first active material target to deposit the first active material thin film 5a with a certain thickness on a surface of the base substrate 1.

The oxygen partial pressure is a ratio of a volume of the oxygen introduced into the process chamber to a total volume of all gases in the process chamber. In an embodiment of the present disclosure, a range of the first preset value a1 is [0, 60%].

According to an embodiment of the present disclosure, the first active material includes an oxide semiconductor material, such as IGZO.

According to an embodiment of the present disclosure, a thickness range of the first active material thin film 5a formed by step S102 is from 200 Å to 300 Å.

In step S103, a second active material thin film 6a is formed on a side of the first active material thin film 5a facing away from the base substrate 1.

According to an embodiment of the present disclosure, a thickness of the second active material thin film 6a is equal to a maximum thickness of a depletion region in the second active material thin film 6a.

Referring to FIG. 7c, in step S103, the second active material thin film 6a is formed by magnetron sputtering in a process environment with an oxygen partial pressure of a second preset value a2. In an embodiment of the present disclosure, gases, such as oxygen and an inert gas (e.g., argon), are introduced into a process chamber, and then the gases are excited into plasma by a magnetic field, and the plasma bombards the second active material target to deposit the second active material thin film 6a with a certain thickness on a surface of the base substrate.

According to an embodiment of the present disclosure, a range of the second preset value a2 includes [0, 60%], and the first preset value a1 is less than the second preset value a2.

According to an embodiment of the present disclosure, the second active material includes the oxide semiconductor material, such as IGZO.

According to an embodiment of the present disclosure, the first active material and the second active material may be the same, and thus step S102 and step S103 may be performed in the same process chamber and by using the same target. In an embodiment of the present disclosure, an oxygen gas flow rate is controlled at a lower level when step S102 is performed, the oxygen gas flow rate is controlled at a higher level when step S103 is performed. The first active material thin film 5a and the second active material thin film 6a are made of the same material and are prepared in the same process chamber, so that the number of times of opening and closing the chamber can be reduced, and a process period can be shortened.

It should be noted that, the case that the first active material and the second active material are the same is only one embodiment in the present disclosure, which does not intend to limit technical solutions of the present disclosure.

According to an embodiment of the present disclosure, a thickness range of the second active material thin film 6a formed by step S103 is from 50 Å to 100 Å.

In practical application, when an oxide semiconductor material thin film is prepared, an increase of the oxygen partial pressure will lead to a decrease in oxygen vacancies in a finally formed thin film, and since carriers of the oxide semiconductor material originate from the oxygen vacancies, carrier concentration of the thin film decreases, and a Fermi potential of the thin film decreases.

According to an embodiment of the present disclosure, by setting the oxygen partial pressure under which the first active material thin film 5a is prepared to be smaller than the oxygen partial pressure under which the second active material thin film 6a is prepared, a Fermi potential of the prepared first active material thin film 5a is larger than that of the prepared second active material thin film 6a.

In step S104, one patterning process is performed on the first active material thin film 5a and the second active material thin film 6a to obtain a pattern of a first active sub-layer 5 and a pattern of a second active sub-layer 6.

The patterning process in the present disclosure generally includes photoresist coating, exposure, development, film etching, photoresist stripping or the like.

Referring to FIG. 7d, the first active material thin film 5a and the second active material thin film 6a are simultaneously patterned through a single patterning process to obtain the first active sub-layer 5 and the second active sub-layer 6 having the same pattern.

It should be noted that, in the present disclosure, after the first active material thin film 5a is prepared, one patterning process may be performed on the first active material thin film 5a to obtain the first active sub-layer 5, then the second active material thin film 6a is formed, and finally, another patterning process is performed on the second active material thin film 6a to obtain the second active sub-layer 6. Such a case should also fall within the scope of the present disclosure.

In step S105, a gate insulating material thin film 3a is formed on a side of the second active sub-layer 6 facing away from the base substrate 1.

Referring to FIG. 7e, the gate insulating material thin film 3a includes silicon oxide (SiOx) and/or silicon nitride (SiNx).

In step S106, a first conductive material thin film 7a is formed on a side of the gate insulating material thin film 3a facing away from the base substrate 1.

Referring to FIG. 7f, the first conductive material thin film 7a includes a metal material, for example, chromium (Cr), an alloy material of Cr, an alloy of molybdenum (Mo) and tantalum (Ta), aluminum (Al), or the like.

In step S107, a patterning process is performed on the gate insulating material thin film 3a and the first conductive material thin film 7a to obtain a pattern of a gate insulating layer 3 and a pattern of a gate electrode 7.

Referring to FIG. 7g, in step S107, the first conductive material thin film 7a is first etched by a wet etching process to obtain the gate electrode 7, and then the gate insulating material thin film 3a is etched by a dry etching process to obtain the gate insulating layer 3. At this time, the gate electrode 7 and the gate insulating layer 3 have the same pattern.

It will be noted that, a case where the gate insulating layer 3 and the gate electrode 7 are formed by one patterning process is one embodiment of the present disclosure. In the present disclosure, after the gate insulating material thin film 3a is prepared, one patterning process may be performed on the gate insulating material thin film 3a to obtain the gate insulating layer 3, then the first conductive material thin film 7a is formed, and finally, another patterning process is performed on the first conductive material thin film 7a to obtain the gate electrode 7. Such a case should also fall within the scope of the present disclosure.

In step S108, a region of the second active sub-layer 6 which is not covered by the gate insulating layer 3 is converted into conductor.

Referring to FIG. 7h, in step S108, hydrogen plasma is injected to a surface of a substrate prepared in step S107, a metal oxide semiconductor material of the region 13 of the second active sub-layer 6 which is not covered by the gate insulating layer 3 contacts and reacts with the hydrogen plasma (hydrogen ions combine with oxygen ions in the metal oxide semiconductor), and the metal oxide of the region 13 is deoxidized, so that the region 13 has conductivity, i.e., the metal oxide semiconductor material is converted into conductor.

It should be noted that, during a process of converting the second active sub-layer 6 into conductor, a phenomenon that a part or all of regions in the first active sub-layer 5 which are not covered by an orthographic projection of the gate insulating layer 3 on the first active sub-layer 5 is converted into conductor may occur, but after the region of the first active sub-layer 5 which is not covered by the orthographic projection of the gate insulating layer 3 on the first active sub-layer 5 is converted into conductor, a conductive channel in the first active sub-layer 5 is not affected, and thus electrical characteristics of the TFT are not affected. In the present disclosure, it is only necessary to ensure that the region of the second active sub-layer 6 which is not covered by the gate insulating layer 3 is converted into conductor.

In step S109, an interlayer dielectric layer 8 is formed on a side of the gate electrode 7 facing away from the base substrate 1, and via holes connecting to the second active sub-layer 6 are formed in the interlayer dielectric layer 8.

Referring to FIG. 7i, a material of the interlayer dielectric layer 8 includes silicon oxide (SiOx) and/or silicon nitride (SiNx).

In step S110, a source electrode 9 and a drain electrode 10 are formed on a side of the interlayer dielectric layer 8 facing away from the base substrate 1.

Referring to FIG. 1, in step S110, a second conductive material thin film is first formed on the side of the interlayer dielectric layer 8 facing away from the base substrate 1, and then a patterning process is performed on the second conductive material thin film to simultaneously prepare a pattern of the source electrode 9 and a pattern of the drain electrode 10.

According to an embodiment of the present disclosure, the second conductive material includes an aluminum alloy, aluminum, or chromium.

The TFT shown in FIG. 1 may be manufactured through the above described steps S101 to S110.

Figure 8:
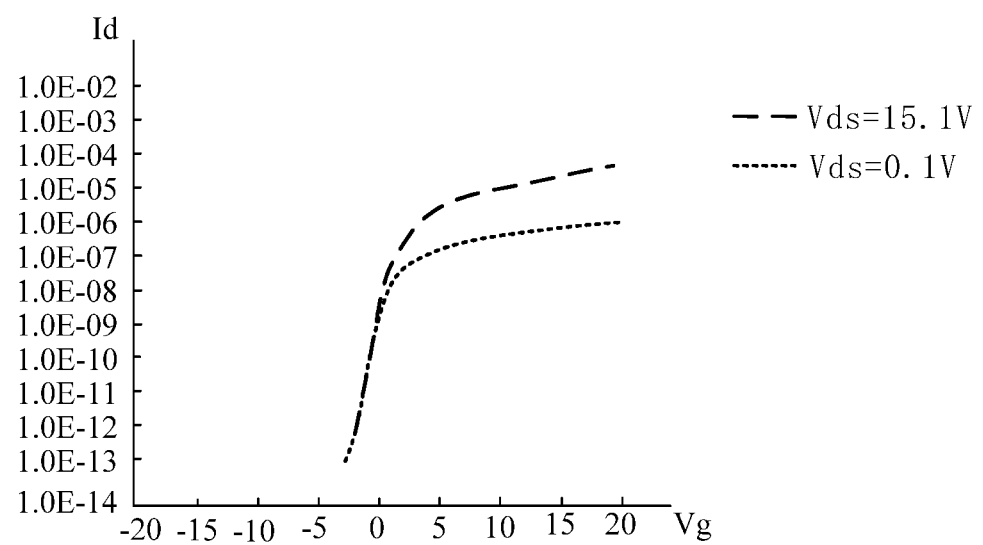
FIG. 8 is a schematic diagram of Id-Vg curves of the TFT manufactured when the first preset value a1 is 30% and the second preset value a2 is 40% under different source-drain voltage differences.

FIG. 8 is a schematic diagram of Id-Vg curves of the TFT manufactured when the first preset value a1 is 30% and the second preset value a2 is 40% under different source-drain voltage differences. As shown in FIG. 8, a structure of the TFT can be seen from FIG. 1, a channel width-to-length ratio W/L of the active layer 4 of the TFT is 20/8, two curves in FIG. 8 are Id-Vg curves corresponding to the source-drain voltage differences Vds of 15.1V and 0.1V, respectively, an abscissa Vg represents the gate voltage Vg and an ordinate Id represents a drain current Id.

As can be seen from FIG. 8, Id-Vg characteristics of the TFT manufactured by the method according to the present disclosure are at normal states.

Table 1 is a table of test data of positive-bias temperature stability of the TFT manufactured when the first preset value a1 is 30% and the second preset value a2 is 40%. As shown in Table 1 below, the active layer 4 of the TFT has the channel width-to-length ratio W/L of 20/8, and the source-drain voltage difference Vds in a test environment is 15.1V.

TABLE 1

| Pressure time (s) | Measured threshold voltage (V) | Offset of threshold voltage (V) |
|---|---|---|
| 0 | −1.309 | 0 |
| 100 | −1.314 | −0.005 |
| 200 | −1.321 | −0.012 |

TABLE 1-continued

| Pressure time (s) | Measured threshold voltage (V) | Offset of threshold voltage (V) |
|---|---|---|
| 300 | −1.323 | −0.014 |
| 600 | −1.321 | −0.012 |
| 1200 | −1.309 | 0 |
| 3600 | −1.286 | 0.023 |

As can be seen from Table 1, the threshold voltage of the TFT shifts by only 0.023V after 3600s of continuous operation, and the TFT has better positive-bias temperature stability.

Table 2 is a table of test data of positive-bias temperature stability of the TFT manufactured when the first preset value a1 is 30% and the second preset value a2 is 50%. As shown in Table 2 below, the active layer of the TFT has the channel width-to-length ratio W/L of 20/8, and the source-drain voltage difference Vds in a test environment is 15.1V

TABLE 2

| Pressure time (s) | Measured threshold voltage (V) | Offset of threshold voltage (V) |
|---|---|---|
| 0 | −1.354 | 0 |
| 100 | −1.378 | −0.024 |
| 200 | −1.388 | −0.034 |
| 300 | −1.403 | −0.049 |
| 600 | −1.400 | −0.046 |
| 1200 | −1.403 | −0.049 |
| 3600 | −1.387 | −0.033 |

As can be seen from Table 2, the threshold voltage of the TFT only shifts by −0.033V after 3600s of continuous operation, and the TFT has better positive-bias temperature stability.

Based on the data in Tables 1 and 2, the TFT provided by the present disclosure has better positive-bias temperature stability.

Figure 9:
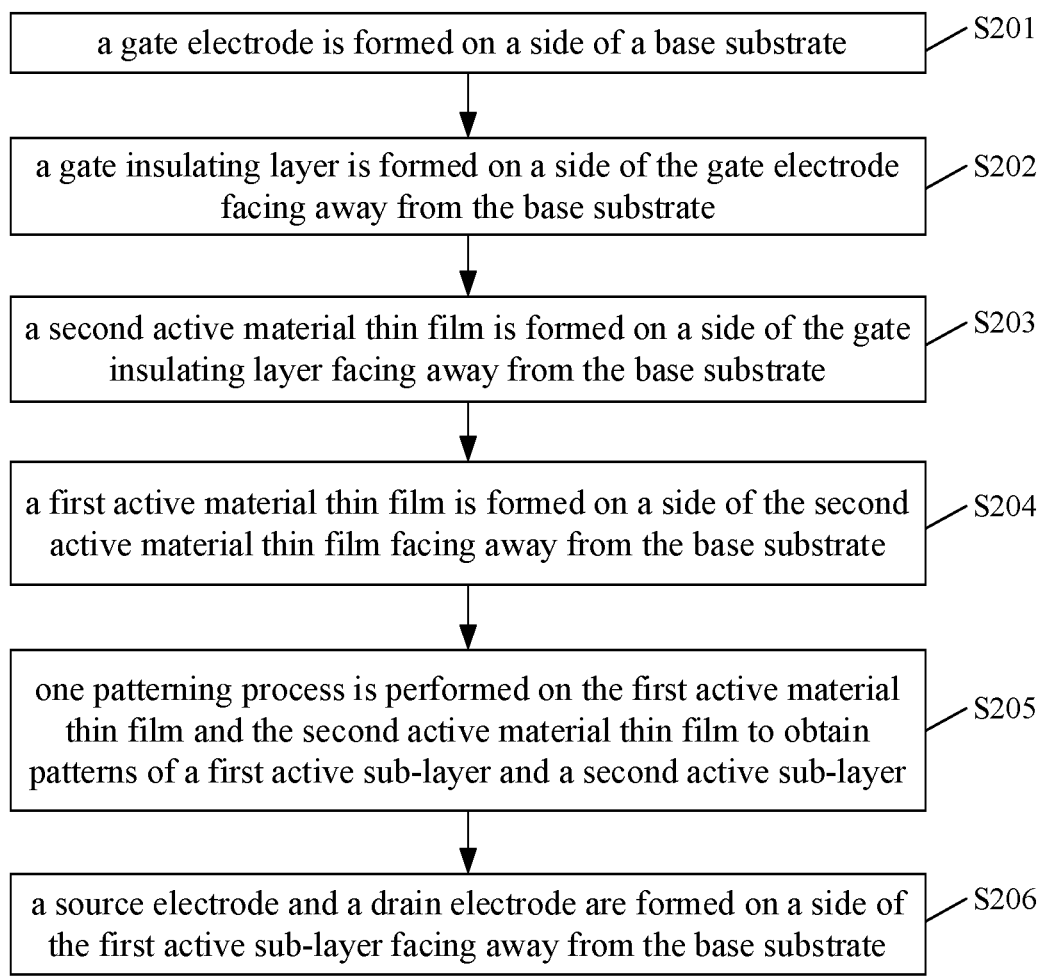
FIG. 9 is a flowchart of a manufacturing method of a TFT according to another embodiment of the present disclosure.
Figure 10A:
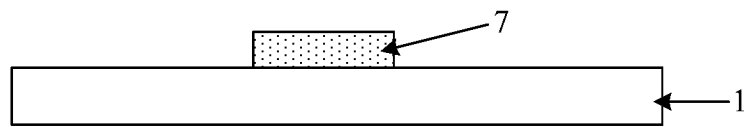
FIGS. 10a to 10e are schematic diagrams of intermediate structures of a TFT manufactured by using the manufacturing method provided in FIG. 9.
Figure 10B:
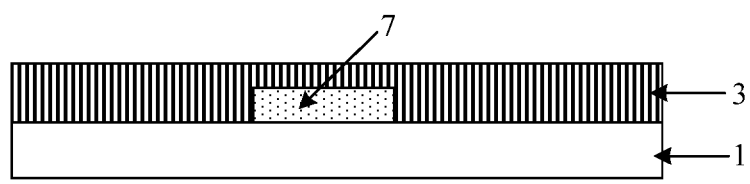
Figure 10C:
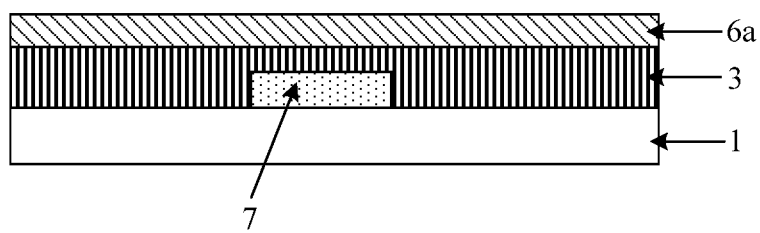
Figure 10D:
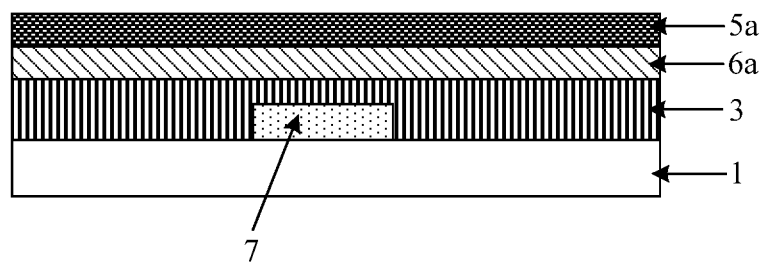
Figure 10E:
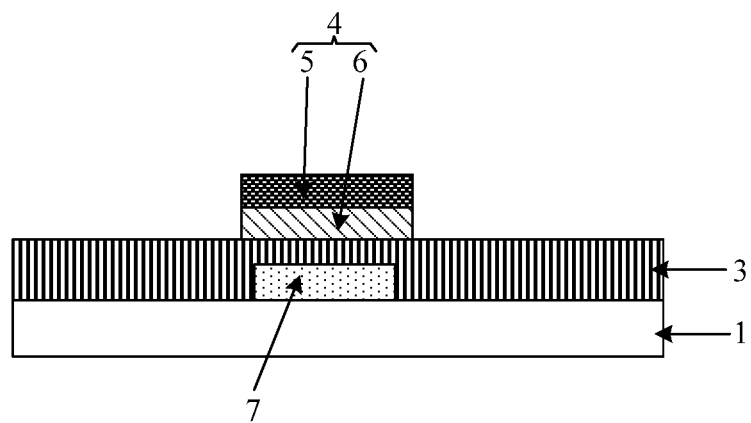

FIG. 9 is a flowchart of a manufacturing method of a TFT according to another embodiment of the present disclosure, and FIGS. 10a to 10e are schematic diagrams of intermediate structures of a TFT manufactured by using the manufacturing method provided in FIG. 9. As shown in FIGS. 9 to 10e, the manufacturing method may be used to manufacture the TFT shown in FIG. 5, and the manufacturing method includes steps S201 to S206.

In step S201, a gate electrode 7 is formed on a side of a base substrate 1.

Referring to FIG. 10a, in step S201, a first conductive material thin film is formed first, and then one patterning process is performed on the first conductive material thin film to obtain the gate electrode 7.

In step S202, a gate insulating layer 3 is formed on a side of the gate electrode 7 facing away from the base substrate 1.

Referring to FIG. 10b, in step S202, a gate insulating material thin film is formed as the gate insulating layer 3 on a surface of the substrate manufactured in step S201 by coating, magnetron sputtering or vapor deposition process.

In step S203, a second active material thin film 6a is formed on a side of the gate insulating layer 3 facing away from the base substrate 1.

According to an embodiment of the present disclosure, a thickness of the second active material thin film 6a is equal to a maximum thickness of a depletion region in the second active material thin film 6a.

Referring to FIG. 10c, the second active material thin film 6a is formed by magnetron sputtering. For specific processes of step S203, reference may be made to the description of step S103 in the foregoing embodiments, which is not repeated here.

In step S204, a first active material thin film 5a is formed on a side of the second active material thin film 6a facing away from the base substrate 1.

According to an embodiment of the present disclosure, a thickness of the first active material thin film 5a is equal to a maximum thickness of a depletion region in the first active material thin film 5a.

Referring to FIG. 10d, the first active material thin film 5a is formed by magnetron sputtering. For specific processes of step S204, reference may be made to the description of step S102 in the foregoing embodiments, which is not repeated here.

According to an embodiment of the present disclosure, a Fermi potential of the first active material thin film 5a is greater than that of the second active material thin film 6a.

In step S205, one patterning process is performed on the first active material thin film 5a and the second active material thin film 6a to obtain patterns of a first active sub-layer 5 and a second active sub-layer 6.

Referring to FIG. 10e, a patterning process is performed to form the first active sub-layer 5 and the second active sub-layer 6. For specific processes of step S205, reference may be made to the description of step S104 in the foregoing embodiments, which is not repeated here.

In step S206, a source electrode 9 and a drain electrode 10 are formed on a side of the first active sub-layer 6 facing away from the base substrate 1.

Referring to FIG. 5, the source electrode 9 and the drain electrode 10 are formed through a patterning process. For specific process of step S206, reference may be made to the description of step S110 in the foregoing embodiments, which is not repeated herein.

The TFT shown in FIG. 5 can be manufactured through the above steps S201 to S206.

An embodiment of the present disclosure further provides an array substrate including a TFT which is the TFT provided in the foregoing embodiments. For the description of the TFT, reference may be made to the foregoing content which is not repeated herein.

An embodiment of the present disclosure further provides a display device including the array substrate in the above embodiment.

The display device in the present disclosure may be a liquid crystal panel, an electronic paper, an OLED panel, a mobile phone, a tablet computer, a television, a display, a notebook computer, a digital photo frame, a navigator or any product or component with a display function.

It will be understood that the above embodiments are merely exemplary embodiments employed to illustrate principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. A thin film transistor (TFT), comprising: an active layer, a gate insulating layer, a source electrode and a drain electrode,
wherein the active layer comprises a first active sub-layer and a second active sub-layer which are arranged in a stacked manner, the second active sub-layer is between the gate insulating layer and the first active sub-layer, a Fermi potential of the first active sub-layer is larger than a Fermi potential of the second active sub-layer, materials of the first and second active sub-layers each comprise indium gallium zinc oxide;

the first active sub-layer is formed by magnetron sputtering in a process environment with an oxygen partial pressure of a first preset value a1, the second active sub-layer is formed by magnetron sputtering in a process environment with an oxygen partial pressure of a second preset value a2, the first preset value a1 is 30% and the second preset value a2 is 40% or 50%, the second active sub-layer is connected to the source electrode and the drain electrode through via holes, and both the first active sub-layer and the second active sub-layer extend beyond the gate insulating layer, the second active sub-layer covers the first active sub-layer, the material of a region of the second active sub-layer covered by the gate insulating layer consists of gallium zinc oxide; the material of a region of the first active sub-layer not covered by the gate insulating layer consists of gallium zinc oxide, and the material of a region of the second active sub-layer not covered by the gate insulating layer consists of IGZ.

2. The TFT of claim 1, wherein in response to a gate voltage applied to a gate electrode of the TFT being less than or equal to a threshold voltage of the TFT, each of a thickness of the depletion region in the first active sub-layer and a thickness of the depletion region in the second active sub-layer is at its maximum thickness.

3. The TFT of claim 2, wherein in response to the gate voltage being greater than the threshold voltage and equal to or less than a first voltage, as the gate voltage increases, the thickness of the depletion region in the first active sub-layer gradually decreases and the thickness of the depletion region in the second active sub-layer is at its maximum thickness, wherein the first voltage is a voltage that causes the thickness of the depletion region in the first active sub-layer to be zero.

4. The TFT of claim 3, wherein in response to the gate voltage being greater than the first voltage and less than a second voltage, as the gate voltage increases, the thickness of the depletion region in the first active sub-layer remains zero and the thickness of the depletion region in the second active sub-layer gradually decreases, wherein the second voltage is a voltage that causes the thickness of the depletion region in the second active sub-layer to be zero.

5. The TFT of claim 1, wherein the second active sub-layer is in direct contact with the gate insulating layer.

6. The TFT of claim 1, wherein carrier concentration of the first active sub-layer is greater than carrier concentration of the second active sub-layer.

7. The TFT of claim 1, further comprising: a gate electrode on a side of the gate insulating layer facing away from the active layer.

8. A display device, comprising a thin film transistor, which comprises an active layer, a gate insulating layer, a source electrode and a drain electrode, wherein the active layer comprises a first active sub-layer and a second active sub-layer which are arranged in a stacked manner, the second active sub-layer is between the gate insulating layer and the first active sub-layer, a Fermi potential of the first active sub-layer is larger than a Fermi potential of the second active sub-layer, materials of the first and second active sub-layers each comprise indium gallium zinc oxide;

the first active sub-layer is formed by magnetron sputtering in a process environment with an oxygen partial pressure of a first preset value a1, the second active sub-layer is formed by magnetron sputtering in a process environment with an oxygen partial pressure of a second preset value a2, the first preset value a1 is 30% and the second preset value a2 is 40% or 50%, the second active sub-layer is connected to the source electrode and the drain electrode through via holes, and both the first active sub-layer and the second active sub-layer extend beyond the gate insulating layer, the second active sub-layer covers the first active sub-layer, the material of a region of the second active sub-layer covered by the gate insulating layer consists of gallium zinc oxide; the material of a region of the first active sub-layer not covered by the gate insulating layer consists of gallium zinc oxide, and the material of a region of the second active sub-layer not covered by the gate insulating layer consists of IGZ.

9. A manufacturing method of a thin film transistor (TFT), comprising:

forming a gate insulating layer;

forming an active layer, the active layer comprising a first active sub-layer and a second active sub-layer arranged in a stacked manner; and forming a source electrode and a drain electrode, wherein the second active sub-layer is between the gate insulating layer and the first active sub-layer, a Fermi potential of the first active sub-layer is larger than a Fermi potential of the second active sub-layer, materials of the first and second active sub-layers each comprise indium gallium zinc oxide;

the first active sub-layer is formed by magnetron sputtering in a process environment with an oxygen partial pressure of a first preset value a1, the second active sub-layer is formed by magnetron sputtering in a process environment with an oxygen partial pressure of a second preset value a2, the first preset value a1 is 30% and the second preset value a2 is 40% or 50%, the second active sub-layer is connected to the source electrode and the drain electrode through via holes, and both the first active sub-layer and the second active sub-layer extend beyond the gate insulating layer, the second active sub-layer covers the first active sub-layer, the material of a region of the second active sub-layer covered by the gate insulating layer consists of gallium zinc oxide; the material of a region of the first active sub-layer not covered by the gate insulating layer consists of gallium zinc oxide, and the material of a region of the second active sub-layer not covered by the gate insulating layer consists of IGZ.

10. The manufacturing method of claim 9, wherein forming the active layer comprises:

forming a first active material thin film;

forming a second active material thin film; and performing a patterning process on the first active material thin film and the second active material thin film to form a pattern of the first active sub-layer and a pattern of the second active sub-layer.

11. The manufacturing method of claim 10, wherein the first active material thin film and the second active material thin film are made of a same material.

12. The manufacturing method of claim 11, wherein forming the gate insulating layer and forming the active layer comprise:

forming the first active material thin film on a base substrate;

forming a second active material thin film on a side of the first active material thin film facing away from the base substrate;

performing a pattern process on the first active material thin film and the second active material thin film to form the pattern of the first active sub-layer and the pattern of the second active sub-layer;

forming a gate insulating material thin film on a side of the second active sub-layer facing away from the base substrate; and performing a pattern process on the gate insulating material thin film to form a pattern of the gate insulating layer.

13. The manufacturing method of claim 9, further comprising:

forming a gate electrode on a side of the gate insulating layer facing away from the base substrate;

forming an interlayer dielectric layer on a side of the gate electrode facing away from the base substrate, wherein via holes connected to the second active sub-layer are formed in the interlayer dielectric layer; and forming the source electrode and the drain electrode on a side of the interlayer dielectric layer facing away from the base substrate, wherein the source electrode and the drain electrode are connected to the second active sub-layer through the via holes, respectively.

14. The manufacturing method of claim 9, wherein forming the gate insulating layer and forming the active layer comprise:

forming, on a base substrate, a gate insulating material thin film as the gate insulating layer;

forming a second active material thin film on a side of the gate insulating layer facing away from the base substrate;

forming a first active material thin film on a side of the second active material thin film facing away from the base substrate; and performing a patterning process on the first active material thin film and the second active material thin film to form a pattern of the first active sub-layer and a pattern of the second active sub-layer.

15. The manufacturing method of claim 14, wherein before forming the gate insulating material thin film on the base substrate, the manufacturing method further comprises:

forming a gate electrode on the base substrate;

after performing the patterning process on the first active material thin film and the second active material thin film, the manufacturing method further comprises:

forming the source electrode and the drain electrode on a side of the first active sub-layer facing away from the base substrate.

* * * * *